(12) United States Patent
Simms et al.

(10) Patent No.: US 11,677,230 B2
(45) Date of Patent: Jun. 13, 2023

(54) MOTOR PROTECTION RELAY INTERFACE USING MAGNETOMETER-BASED SENSORS

(71) Applicant: Eaton Intelligent Power Limited, Dublin (IE)

(72) Inventors: Stan R. Simms, Arden, NC (US); Thomas A. Farr, Candler, NC (US); Hanning Tang, Asheville, NC (US)

(73) Assignee: Eaton Intelligent Power Limited, Dublin (IE)

( * ) Notice: Subject to any disclaimer, the term of this patent is extended or adjusted under 35 U.S.C. 154(b) by 831 days.

(21) Appl. No.: 16/556,970

(22) Filed: Aug. 30, 2019

(65) Prior Publication Data

US 2021/0066908 A1 Mar. 4, 2021

(51) Int. Cl.
*H02H 7/09* (2006.01)
*H02H 7/08* (2006.01)
*H02P 8/36* (2006.01)
*G01R 33/07* (2006.01)
*H02P 29/02* (2016.01)

(52) U.S. Cl.
CPC ............ *H02H 7/09* (2013.01); *H02H 7/0822* (2013.01); *H02P 8/36* (2013.01); *G01R 33/072* (2013.01); *H02P 29/02* (2013.01)

(58) Field of Classification Search
CPC ...... H02H 7/09; H02H 7/0822; G01R 33/072; H02P 8/36; H02P 29/02
See application file for complete search history.

(56) References Cited

U.S. PATENT DOCUMENTS

| 7,341,221 B1 | 3/2008 | Wilson |
| 9,767,574 B2 | 9/2017 | Menozzi |

(Continued)

FOREIGN PATENT DOCUMENTS

| CA | 3026915 | 8/2019 |
| CA | 3090631 | 2/2021 |

(Continued)

OTHER PUBLICATIONS

CA Examination Search Report for CA3090631, dated Sep. 3, 2021, 4 pages.

(Continued)

*Primary Examiner* — Kawing Chan
(74) *Attorney, Agent, or Firm* — Stanek Lemon Crouse & Meeks, P.A.

(57) ABSTRACT

An apparatus includes a magnetometer-based current sensor (e.g., a Hall-effect or fluxgate-based current sensor) configured to sense a magnetic field generated by a current in at least one conductor connecting a motor drive output to a motor and to responsively produce a first current sense signal and a magnetometer-based voltage sensor (e.g., a Hall-effect or fluxgate-based voltage sensor) configured to sense a magnetic field generated in response to a voltage of the at least one conductor and to responsively produce a first voltage sense signal. The apparatus further includes a signal conversion circuit configured to receive the first current sense signal and the first voltage sense signal and to generate a second current sense input and a second voltage sense input for provision to a current sense input and a voltage sense input, respectively, of a motor protection relay that protects the motor.

18 Claims, 9 Drawing Sheets

(56) References Cited

U.S. PATENT DOCUMENTS

| | | | |
|---|---|---|---|
| 9,767,575 B2 | 9/2017 | Menozzi | |
| 9,767,576 B2 | 9/2017 | Menozzi | |
| 9,767,577 B2 | 9/2017 | Menozzi | |
| 9,768,609 B2 | 9/2017 | Lloyd et al. | |
| 9,875,579 B2 | 1/2018 | Menozzi et al. | |
| 10,304,199 B2 | 5/2019 | Menozzi | |
| 10,304,200 B2 | 5/2019 | Menozzi | |
| 10,424,071 B2 | 9/2019 | Menozzi | |
| 10,430,954 B2 | 10/2019 | Menozzi | |
| 10,712,738 B2 | 7/2020 | Cella et al. | |
| 10,732,621 B2 | 8/2020 | Cella et al. | |
| 10,754,334 B2 | 8/2020 | Cella et al. | |
| 10,795,350 B2 | 10/2020 | Cella et al. | |
| 10,816,939 B1 | 10/2020 | Coleman | |
| 10,824,140 B2 | 11/2020 | Cella et al. | |
| 10,866,584 B2 | 12/2020 | Cella et al. | |
| 10,908,602 B2 | 2/2021 | Cella et al. | |
| 10,921,801 B2 | 2/2021 | Cella et al. | |
| 10,983,507 B2 | 4/2021 | Cella et al. | |
| 10,983,514 B2 | 4/2021 | Cella et al. | |
| 11,003,179 B2 | 5/2021 | Cella et al. | |
| 11,009,865 B2 | 5/2021 | Cella et al. | |
| 11,029,680 B2 | 6/2021 | Cella et al. | |
| 11,036,215 B2 | 6/2021 | Cella et al. | |
| 11,048,248 B2 | 6/2021 | Cella et al. | |
| 11,054,817 B2 | 7/2021 | Cella et al. | |
| 11,067,976 B2 | 7/2021 | Cella et al. | |
| 11,086,311 B2 | 8/2021 | Cella et al. | |
| 11,092,955 B2 | 8/2021 | Cella et al. | |
| 11,184,967 B2 | 11/2021 | Coleman | |
| 11,299,981 B2 | 4/2022 | Nguyen et al. | |
| 11,354,812 B2 | 6/2022 | Menozzi et al. | |
| 2010/0254057 A1* | 10/2010 | Chen .................. | H02H 3/04 340/661 |
| 2011/0298406 A1* | 12/2011 | Tamai .................. | H02P 1/46 318/400.33 |
| 2016/0066909 A1 | 3/2016 | Baber et al. | |
| 2016/0066911 A1 | 3/2016 | Baber et al. | |
| 2016/0066916 A1 | 3/2016 | Overmyer et al. | |
| 2016/0256071 A1 | 9/2016 | Shelton, IV et al. | |
| 2016/0256156 A1 | 9/2016 | Shelton, IV et al. | |
| 2016/0256160 A1 | 9/2016 | Shelton, IV et al. | |
| 2016/0256161 A1 | 9/2016 | Overmyer et al. | |
| 2016/0256184 A1 | 9/2016 | Shelton, IV et al. | |
| 2016/0256187 A1 | 9/2016 | Shelton, IV et al. | |
| 2017/0079641 A1 | 3/2017 | Overmyer et al. | |
| 2017/0079643 A1 | 3/2017 | Yates et al. | |
| 2017/0079647 A1 | 3/2017 | Yates et al. | |
| 2017/0196561 A1 | 7/2017 | Shelton, IV et al. | |
| 2017/0209145 A1 | 7/2017 | Swazye et al. | |
| 2021/0066908 A1 | 3/2021 | Simms et al. | |

FOREIGN PATENT DOCUMENTS

| | | |
|---|---|---|
| CN | 104428692 A | 3/2015 |
| EP | 2 830 176 | 2/2017 |
| EP | 3154188 A1 | 4/2017 |

OTHER PUBLICATIONS

An et al., "Design and Testing of a New Protection Relay for Variable Speed DFI Motor Generators," 12th International Conference on Developments in Power System Protection, Jan. 2014, 6 pages.

GE Grid Solutions, "MiCOM Agile 345 & P348, Generator Protection for Variable Speed, Double Fed Induction Machines;" General Electric Company Brochure EN-2018-08-Grid-GA (2018); 8 pages.

Gardell, et al; "Adjustable-Speed Drive Motor Protection Applications and Issues;" IEEE Transactions on Industry Applications, vol. 50 No. 2, Mar./Apr. 2017; pp. 1364-1372.

ABB Control Technical Catalogue, Voltage Sensors, Current Sensors, 1SBC 0011 99 R1001, Transtronic, EM 010 Traction Voltage Sensors, https://vww.rgbautomatyka.pl, Printed from the Internet Sep. 19, 2019, Admitted Prior Art, p. 45.

IEEE Guide for AC Motor Protection, IEEE Standards Association, Power System Relaying Committee, IEEE Std C37.96 2012 (Revision of IEEE Std C37096-2000) Feb. 20, 2013, 160 pages.

SEL-710-5 Motor Protection Relay, Induction and Synchronous Motor Control and Protection, Broken Rotor Bar Detection, and Arc-Flash Detection. Schweitzer Engineering Laboratories, Inc., Jun. 29, 2018, 36 pages.

Eaton | Cutier-Hammer, IB2602002E, MP-4000 Motor Protection Relay, 2007, 116 pages.

Eaton | EMR-5000 Eaton Motor Relay, IM02602012E, 2011, 760 pages.

GE Power Management, 469 Motor Management Relay Support Documents, Frequency Asked Questions, Jul. 24. 2000, 5 pages.

Khan et al., "Considerations for Dependability of the Motor Protection on Current Transformers Performancein VFD Applications," IEEE Transactions on Industry Applications, vol. 53, No. 3, May/Jun. 2017, pp. 2635-2641, 8 pages.

Khan et al. "Performance of CTs and Relays at Low Frequencies," 2016 69th Annual Conference for Protective Relay Engineers (CPRE), Apr. 4-7, 2016, 18 pages.

Lem, Voltage Transducer CV 4-8000/SP2, www.lem.com. Printed from the Internet Sep. 19, 2019, Admitted Prior Art, 3 pages.

Texas Instruments, OPA454 High-Voltage (100-V), High-Current (50-mA) Operational Amplifiers, G=1 Stable, SB0S391B, Dec. 2007—Revised Mar. 2016, 48 pages.

Xiamen ZT Technology Co., Ltd., CHV-6KV-~20KV Closed-loop Hall Voltage Transducer, , http://www.zntar.com/closed-loop-hall-voltage-transducers/673-chv6kv20kv-closed-loop; Printed from the Internet Mar. 1, 2019, Admitted Prior Art, 2 pages.

Lem, Current Transducer LF 505-S/SP13, www.lem.com, Printed from the Internet Sep. 19, 2019, Admitted Prior Art, 3 pages.

Linear Technology, LTC6090/LTC6090-5, 140V CMOS Rail-to-Rail Output, Picoamp Input Current Op Amp, www.linear.com/LTC6090, Printed from the Internet Sep. 19, 2019, Admitted Prior Art, 26 pages.

Burr-Brown Products from Texas Instruments, OPA 549, SBOS093E, March 1999—Revised Oct. 2005, 19 pages.

Honda et al., "25W-500W Scalable Output Power Class D Audio Power Amplifier Reference Design Using the IRS2092 Protected: Digital Audio Driver," International Rectifier, Reference Design, IRAUDAMP7D Rev. 2.9. www.ifr.com, Printed from the Internet Sep. 19, 2019, Admitted Prior Art, 41 pages.

All-4-One International Transformers, Chassis Mount, Signal Transformer, 2015, 2 pages.

* cited by examiner

MOTOR PROTECTION RELAY INTERFACE USING MAGNETOMETER-BASED SENSORS

BACKGROUND

The inventive subject matter relates to electrical apparatus and methods and, more particularly, to protection apparatus for electric motors.

Motor protection relays are commonly used to protect electric motors in industrial and other applications. For example, motor protection relays may be in medium voltage adjustable frequency drive (AFD) applications to provide Zone 3 protection as defined in IEEE Std. C37.96.

FIG. 1 illustrates a conventional motor protection relay arrangement in an AFD application. An AFD 20 may be used to drive a motor 10 via an output filter 30. Current transformers (CT) 60 and potential transformers (PT) 70 (here shown as connected in an open-delta configuration) may be used to measure current and voltage, respectively, provided to the motor 10. The CTs 60 and the PTs 70 provide inputs to a motor protection relay 50. Responsive to the current and voltage sense inputs, the motor protection relay 50 may detect undesirable motor conditions (e.g., overcurrent, locked rotor, internal faults, etc.) and take protective actions, such as tripping a contactor 40 that connects the AFD 20 and filter 30 to the motor 10 and/or providing alarms to operators. Other conventional AFD arrangements may omit the output contactor 40 and the motor protection relay 50 may enable/disable the AFD 20. Other conventional arrangements may use a bypass contactor (not shown) configured to bypass an AFD (e.g., the AFD 20 shown in FIG. 1) after the AFD brings the motor up to line speed, and the motor protection relay may be configured open the bypass contactor and/or disable the AFD in response to detection of an undesirable motor condition. In other conventional arrangements, an output contactor (e.g., a contactor such as the output contactor 40) may be placed at the output of the AFD and, when a bypass contactor is closed, the AFD and the output contactor are both disabled. In such applications, the motor protection relay may trigger either the bypass contactor or the output contactor, depending on the mode of operation.

The use of conventional CTs AFD applications as shown in FIG. 1 can be problematic, as conventional CTs may be undependable at frequencies below 15 Hz due to saturation at these frequencies. Low frequency performance of conventional CTs can be improved through use of an oversized core, but accurate measurement at very low frequencies (e.g., 1.5 Hz) may require gross oversizing. Alternatives have been proposed that include replacing conventional CTs with Rogowski coil CTs, but these may exhibit poor phase response and/or very low frequency magnitude errors. Other alternatives may include using shunt resistors for current sensing, but such solutions may not provide desired galvanic isolation.

SUMMARY

Some embodiments of the inventive subject matter provide an apparatus including a magnetometer-based current sensor configured to sense a magnetic field generated by a current in at least one conductor connecting a motor drive output to a motor and to responsively produce a first current sense signal and a magnetometer-based voltage sensor configured to sense a magnetic field generated in response to a voltage of the at least one conductor and to responsively produce a first voltage sense signal. The apparatus further includes a signal conversion circuit configured to receive the first current sense signal and the first voltage sense signal and to generate a second current sense input and a second voltage sense input for provision to a current sense input and a voltage sense input, respectively, of a motor protection relay that protects the motor.

The current sensor and/or the voltage sensor may include, for example, a Hall effect sensor. For example, the current sensor or the voltage sensor may include a closed-loop Hall effect sensor and the signal conversion circuit may include a burden resistor configured to conduct a current produced by the closed-loop Hall effect sensor and an amplifier configured to provide the second current sense or the second voltage sense signal to the motor protection relay responsive to a voltage across the burden resistor. The signal conversion circuit may further include a low pass filter configured to filter an output of the amplifier. The low pass filter may be configured to pass a base frequency of the motor drive and at least one switching frequency of the motor drive.

In further embodiments, an apparatus includes an adjustable-frequency drive (AFD) configured to be coupled to a motor by at least one conductor. The apparatus further includes at least one magnetometer-based sensor configured to sense a current in the at least one conductor and/or to sense a voltage on the at least one conductor and to responsively produce a sense signal, and a motor protection relay configured to protect the motor responsive to the sense signal. The at least one magnetometer-based sensor may include, for example, a Hall effect sensor or a fluxgate sensor. The sense signal produced by the at least one magnetometer-based sensor may include a first sense signal, and the apparatus may further include a signal conversion circuit configured to receive the first sense signal and to generate second sense signal that is provided to a sense input of the motor protection relay.

DETAILED DESCRIPTION

Figure 1:
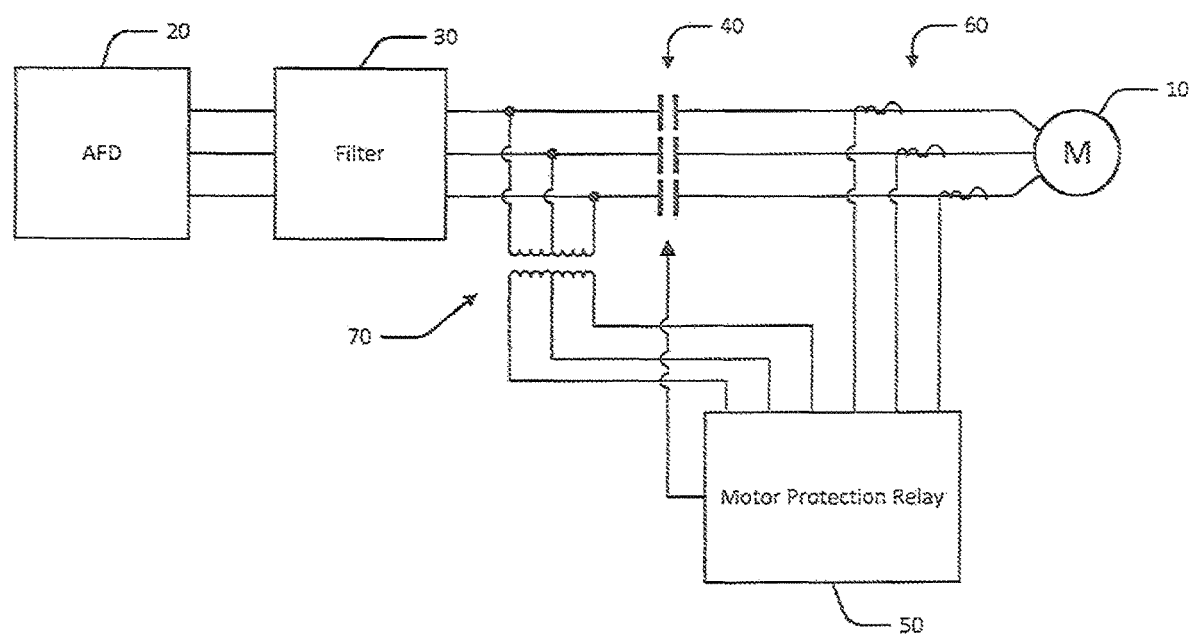
FIG. 1 is a schematic diagram illustrating a conventional motor protection relay arrangement for an AFD application.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 2:
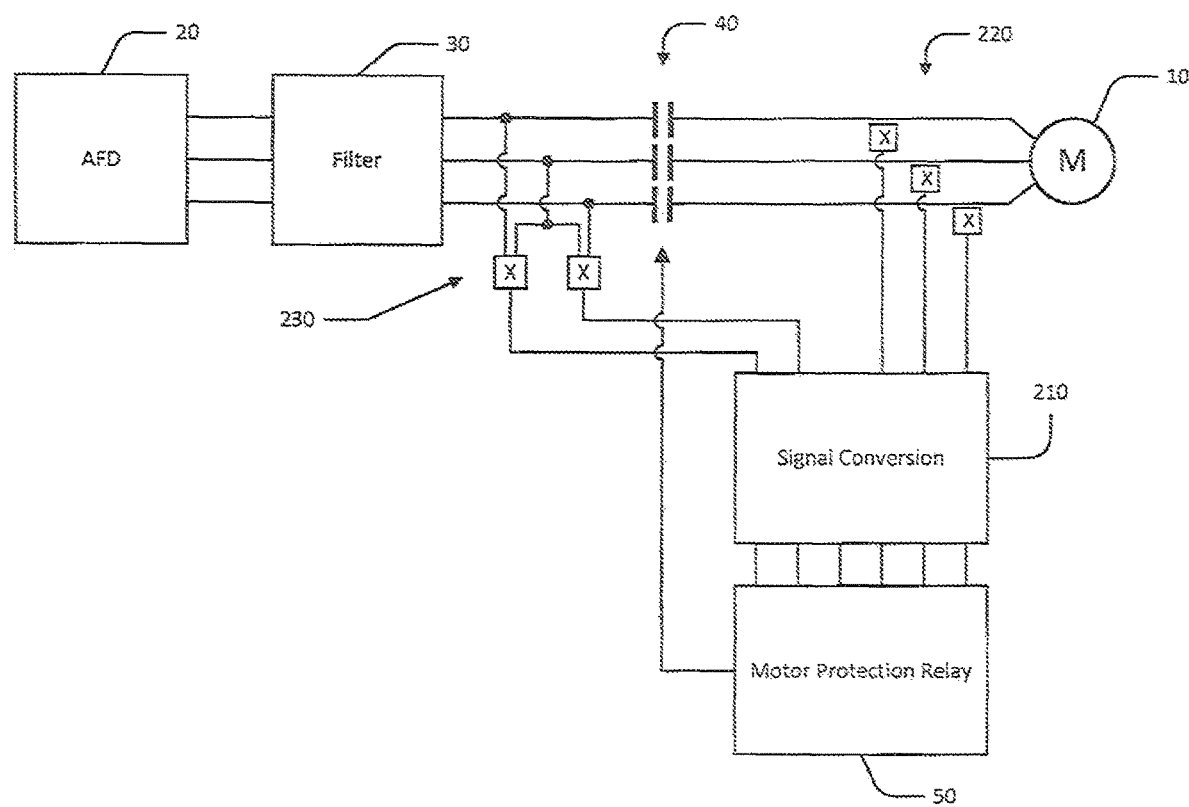
FIG. 2 is a schematic diagram illustrating a motor protection relay arrangement for an AFD application according to some embodiments of the inventive subject matter.

FIG. 2 is a schematic diagram illustrating a motor protection relay arrangement according to some embodiments of the inventive subject matter. An AFD 20 may be used to drive a motor 10 via an output filter 30. Magnetometer-based current sensors 220 and voltage sensors 230 are used to measure current and voltage, respectively, provided to the motor 10. The magnetometer-based current sensors 220 may include, for example, Hall effect current sensors that use semiconductor elements to detect magnetic fields generated by currents in conductors 32 connecting the filter 30 to the motor 10 and, thus, are not as vulnerable to the low-frequency issues associated with the use of CTs. Examples of such Hall effect current sensors include the LF 505-S/SP13 current transducer distributed by LEM Components. Similarly, the magnetometer-based voltage sensors 230 may also be Hall effect voltage sensors, examples of which include the CV 4-8000/SP2 voltage transducer produced by LEM Components, the ABB Transtronic EM 010 Traction voltage sensor, and the CHV-6 KV-20 KV voltage transducer produced by Xiamen ZT Technology. In further embodiments, the magnetometer-based current sensors 220 and/or the voltage sensors 230 may be other types of magnetometer-based sensors, such as fluxgate-based sensors, magnetoresistive sensors, and the like, which can provide galvanic isolation and use magnetic field sensing mechanisms that are not subject to the saturation phenomena that can affect the performance of conventional CTs and PTs at low frequencies.

The current sensors 220 and the voltage sensors 230 are interfaced to a motor protection relay 50 by a signal conversion circuit 210, which receives outputs from the current sensors 220 and the voltage sensors 230 and generates corresponding current sense and voltage sense inputs for a motor protection relay 50, which may be a conventional motor protection relay that is configured to normally receive inputs from conventional CTs and PTs. The motor protection relay 50 may perform various motor protection operations responsive to the signals receives from the signal conversion circuit 210, such as triggering a contactor 40 or other circuit interruption device that connects the AFD 20 and the filter 30 to the motor 10.

Figure 3:
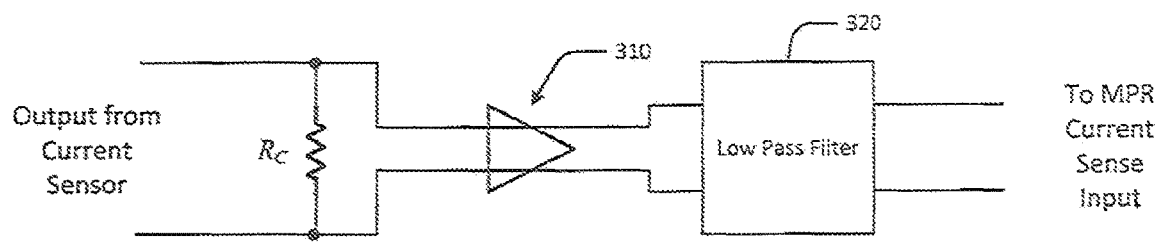
FIG. 3 is a schematic diagram illustrating current sensor signal conversion circuitry according to some embodiments of the inventive subject matter.

In some embodiments, the current sensors 220 may be closed-loop Hall effect sensors that produce current outputs representative of the current passing through the conductors 32. Because the currents output by such sensors may be relatively small, the signal conversion circuit 210 may receive the current output from a current sensor 220 and pass it through a burden (sensing) resistor $R_c$ to generate a voltage that is applied to a high-current output amplifier 310, as illustrated in FIG. 3. The output of the amplifier 310 is filtered by a low-pass filter 320 before application to a current sense input of the motor protection relay 50, thus supporting current levels comparable to a conventional CT (e.g., 1A-5A). The amplifier 310 may include, for example, a high-current class D switching amplifier, such as an Infineon IRF IRAUDAMP7s, Infineon IRAUDAMP7d, or a Texas Instruments OPA549.

Figure 4:
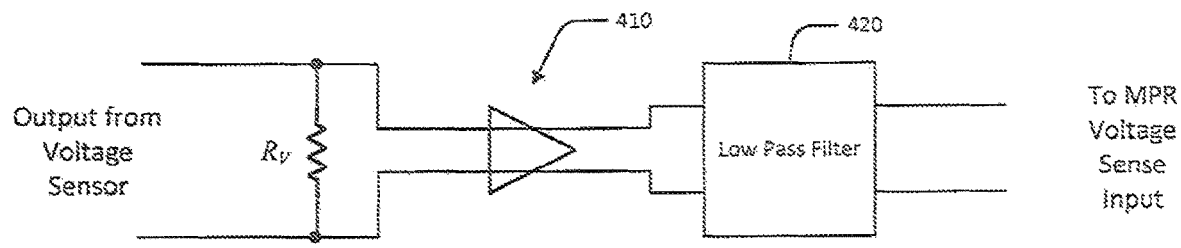
FIG. 4 is a schematic diagram illustrating voltage sensor signal conversion circuitry according to some embodiments of the inventive subject matter.

Referring to FIG. 4, the signal conversion circuit 210 may also include a burden resistor $R_v$ through which a current provided by a Hall effect voltage sensor (e.g., the voltage sensors 230 of FIG. 2) is passed to develop a voltage that is amplified by a high-voltage amplifier 410, such as a Linear Technology LTC6090 or a Texas Instruments OPA454. The output of the amplifier 410 is filtered by a low-pass filter 420 to produce a signal that can be applied to a voltage sense input of the motor protection relay 50, with a voltage range that is usable by the motor protection relay 50.

Figure 5:
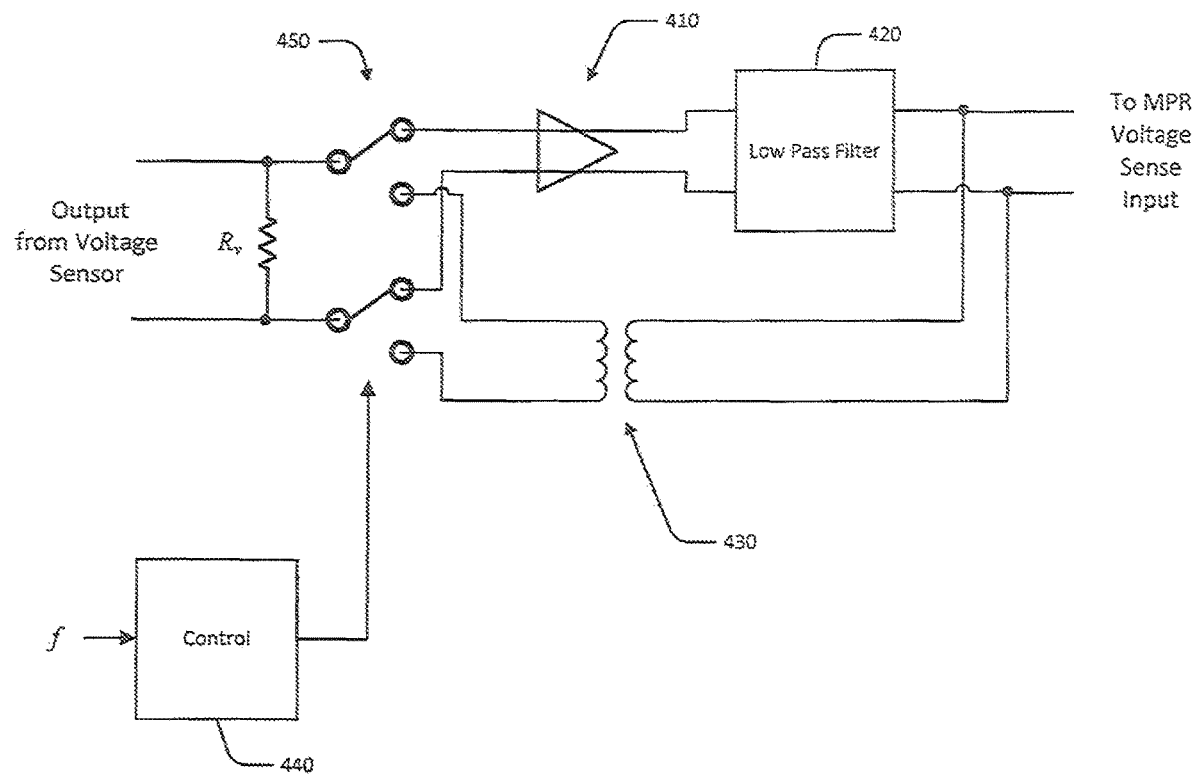
FIG. 5 is a graph illustrating a frequency response of a low pass filter that may be used in the conversion circuitry of FIGS. 3 and 4.

In some embodiments, the voltage sense signal conversion circuitry shown in FIG. 4 may not be capable of covering the entire range of frequencies and output voltages of the AFD, due to limitations on the power supply voltage of the amplifier 410. As illustrated in FIG. 5, in some embodiments, voltage sense signal conversion circuit along the lines of FIG. 4 may further include a bypass circuit, here shown as including a switch 450 and a control circuit 440 that controls the switch 450 to selectively apply the burden resistor voltage $V_R$ to the amplifier 410 and to a primary winding of a potential transformer 430 that has its secondary winding coupled to the voltage sense input of the motor protection relay. In particular, the control circuit 440 may cause the switch 450 to apply the burden resistor voltage $V_R$ to the amplifier 410 when a measure of the frequency f at which the motor is operating meets a certain criterion. For example, the measurement of the frequency f may be derived from the burden resistor voltage $V_R$, and the switch 450 may apply the burden resistor voltage $V_R$ to the amplifier 410 when the burden resistor voltage $V_R$ is at a level below that at which the output of the amplifier 410 may saturate. When the burden resistor voltage $V_R$ exceeds this threshold, the control circuit 440 may cause a make before break transition of the burden resistor voltage $V_R$ to the potential transformer 430 to enable provision of greater voltage levels to the voltage sense input of the motor protection relay.

Figure 6:
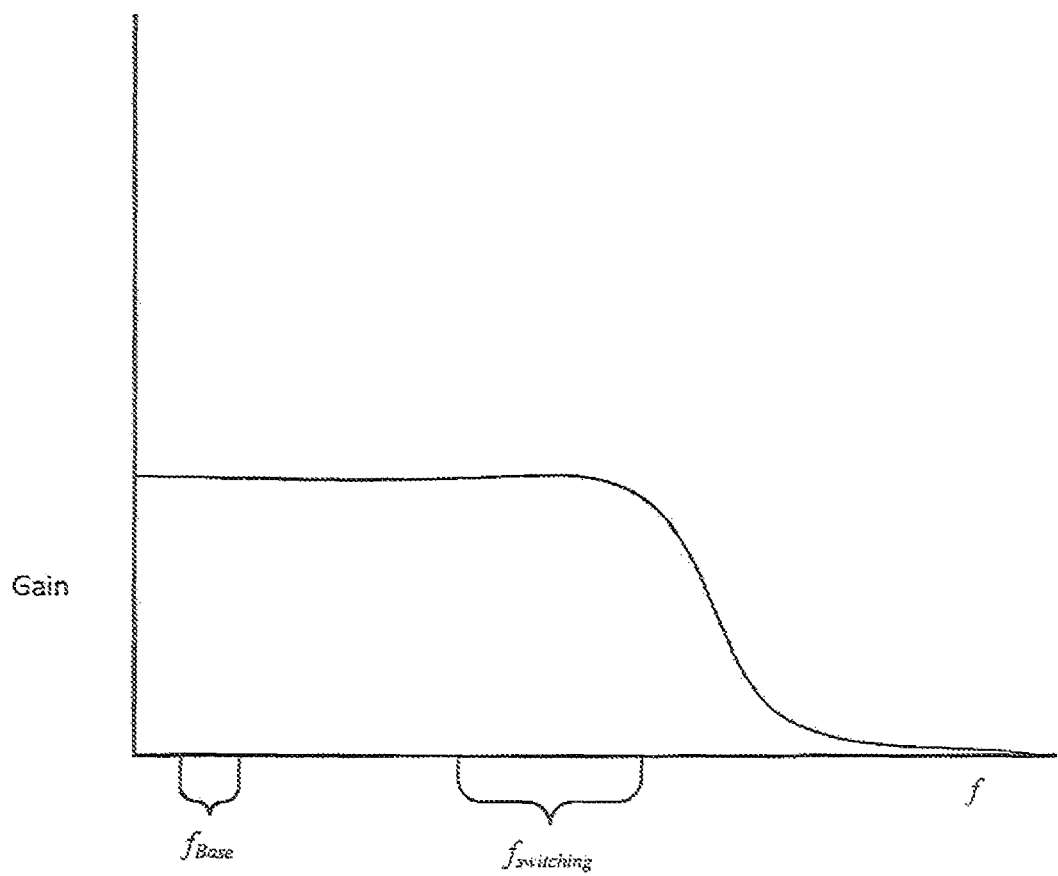
FIG. 6 is a schematic diagram illustrating voltage sensor signal conversion circuitry according to further embodiments of the inventive subject matter.

Referring to FIG. 6, the low-pass filters 320, 420 illustrated in FIGS. 3-5 may be designed to pass the base operating frequencies (e.g., 0-60 Hz) of the AFD, along with frequencies (e.g., fundamental and harmonics) associated with pulse width modulation switching performed by the AFD. This can allow the motor protection relay 50 to monitor harmonic content. Higher frequency dv/dt content in PWM waveforms (e.g., frequencies ranging above 100 Khz) may not be needed and can be filtered out by either the frequency response of the current or voltage sensors themselves (e.g., 35 Khz for voltage sensors, 10 kHz for current sensor) or by filters as shown in FIGS. 3-5. Similar filtering could also be provided, for example, by a filter (e.g., a SINE or dv/dt filter) in a power stage of an AFD.

As explained above, some embodiments inventive subject matter may use magnetometer-based sensors other than closed-loop Hall sensors, such as open-loop Hall effect or open-loop flux-gate sensors. Such sensors may, however, have a less desirable noise rejection capability in comparison to closed-loop sensors. It will also be understood that a motor protection relay could incorporate current and/or voltage sense inputs that accept signals from magnetometer-based current and/or voltage sensors, which could eliminate the need for signal conversion circuitry. Some embodiments may use only magnetometer-based current sensors, e.g., in lower-tier motor protection relay applications that use motor protection relays that only accept current sense inputs, such as the Eaton MP-3000 and EMR 3000. It can also be appreciated that other sensor arrangements other than open-delta and three current sensor arrangements can be used to acquire motor voltage and phase current information.

In further embodiments, both magnetometer-based sensors and conventional current and/or voltage sensors may be used selectively over a range of frequencies of operation. For example, magnetometer-based sensors may be used to provide current and voltage sense inputs to a motor protection relay when an AFD is operating at lower frequency ranges, with the current and voltage sense inputs of the motor protection relay switching over current and voltage sense signals from conventional CTs and PTs when the AFD is operating at higher frequencies.

Figure 7:
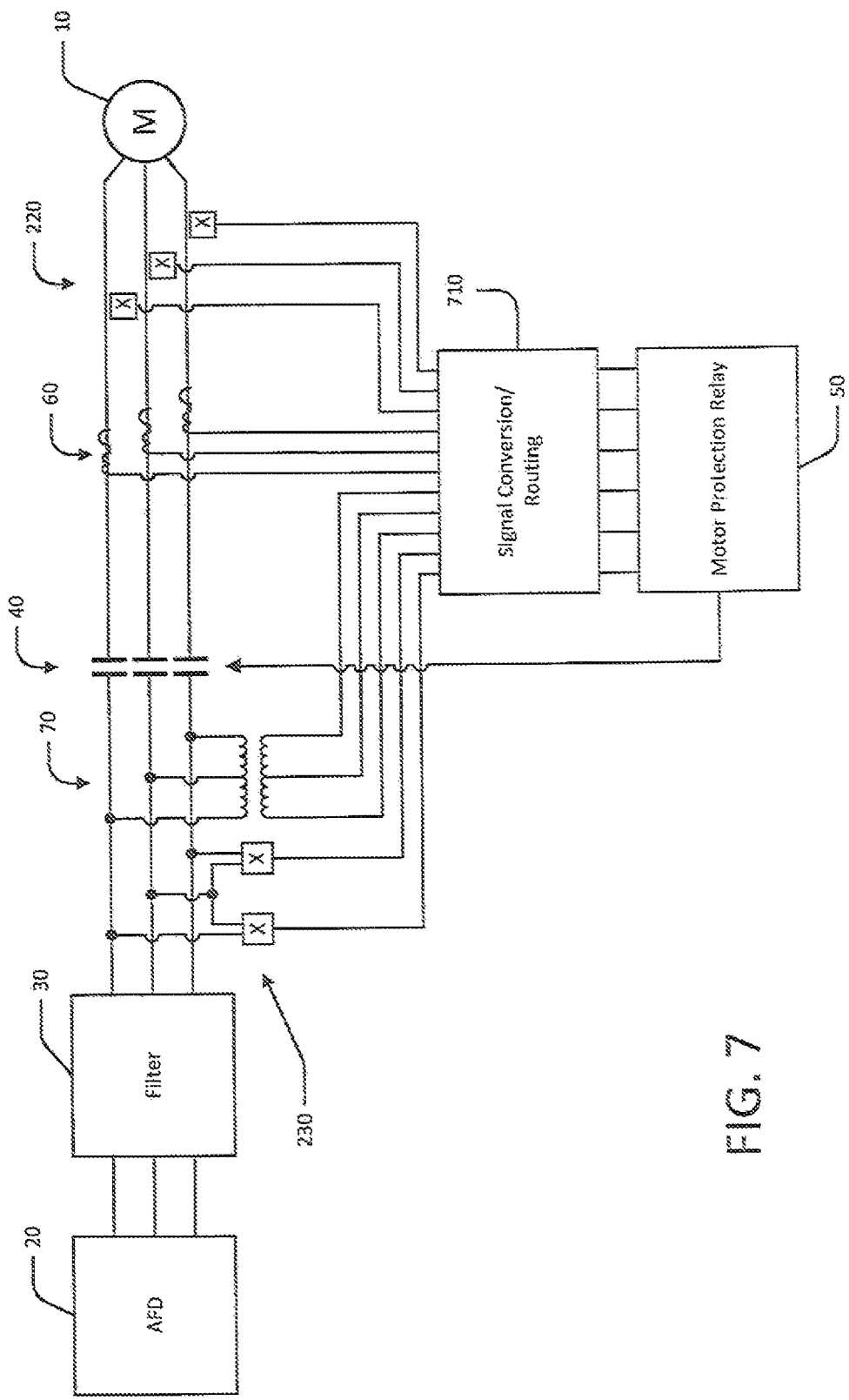
FIG. 7 is a schematic diagram illustrating a motor protection relay arrangement for an AFD application according to some embodiments of the inventive subject matter.
Figure 8:
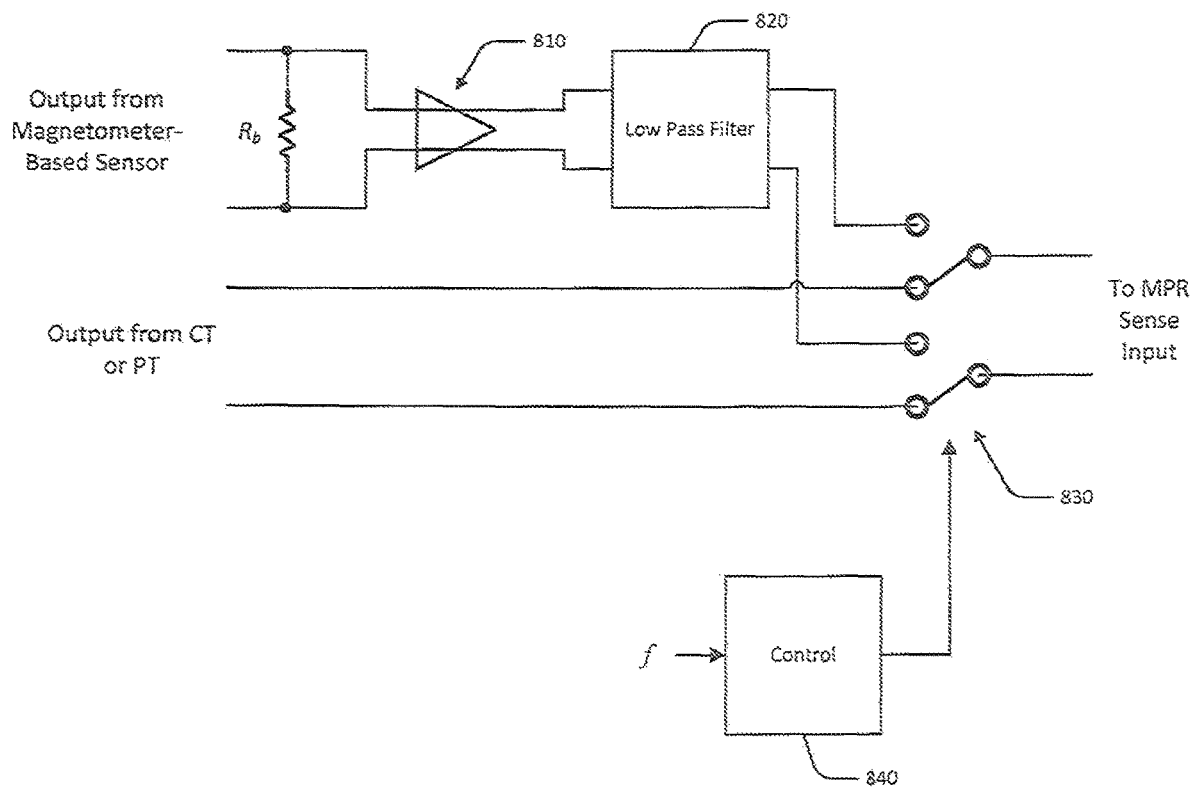
FIG. 8 is a schematic diagram illustrating signal conversion and routing circuitry for the arrangement of FIG. 7.

An example of such a configuration is shown in FIG. 7. A signal conversion/routing circuit 710 may be coupled to conventional CTs 60, PTs 70, Hall effect current sensors 220 and Hall effect voltage sensors. At lower frequencies, the signal conversion/routing circuit 710 may utilize the Hall effect current sensors 220 and the Hall effect voltage sensors 220 to generate inputs into a motor protection relay 50. At higher frequencies, the signal conversion/routing circuit 710 may provide the outputs of the CTs 60 and the PTs 70 to the sense inputs of the motor protection relay 50. As shown in FIG. 8, for example, the signal conversion/routing circuit may include conversion circuit for outputs of the Hall effect current sensors and the Hall effect voltage sensors along the lines shown in FIGS. 3 and 4, including a burden resistor Rb, amplifier 810 and low pass filter 820. Based on a measure of the frequency f at which the motor is being driven, a control circuit 840 may selectively apply the output of the signal conversion circuitry or the output from a CT or PT to the sense input of a motor protection relay, e.g., by controlling a switch 830. The measure of the frequency f may be derived, for example, from the voltage across the burden resistor Rb.

Figure 9:
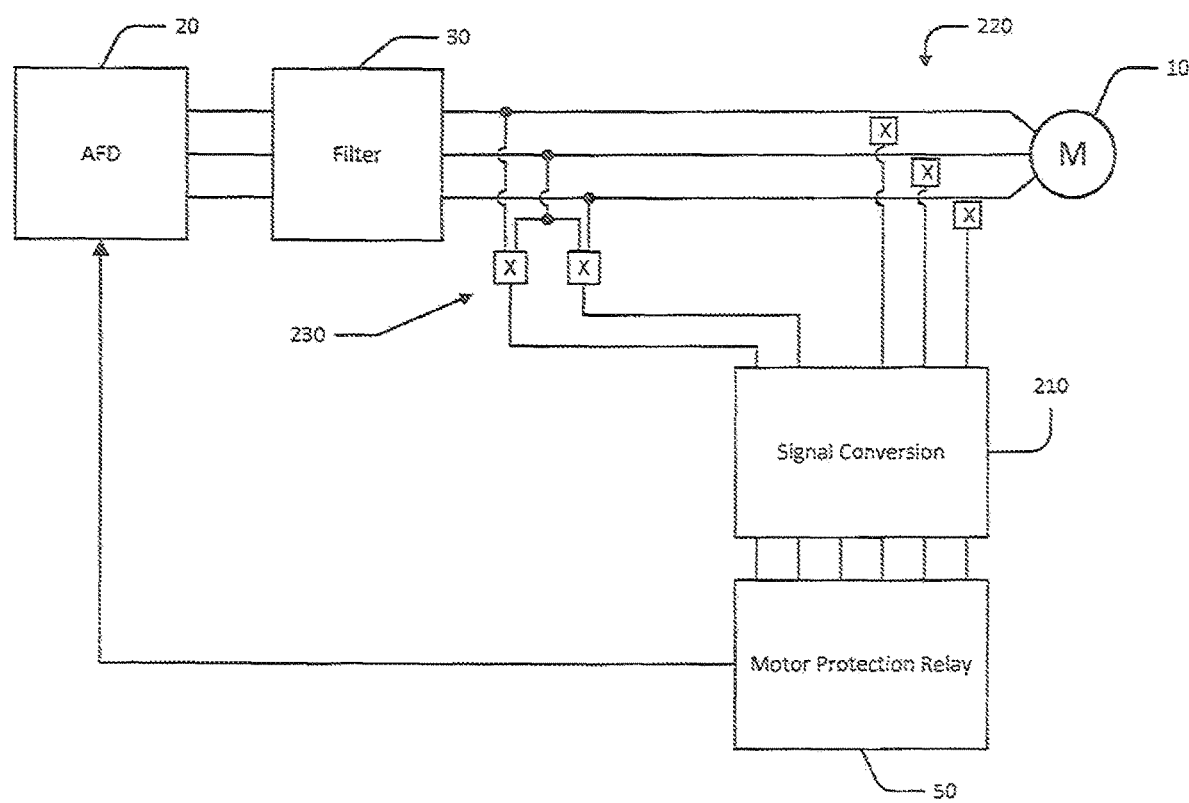
FIG. 9 is a schematic diagram illustrating a motor protection relay arrangement for an AFD application according to some embodiments.
Figure 10:
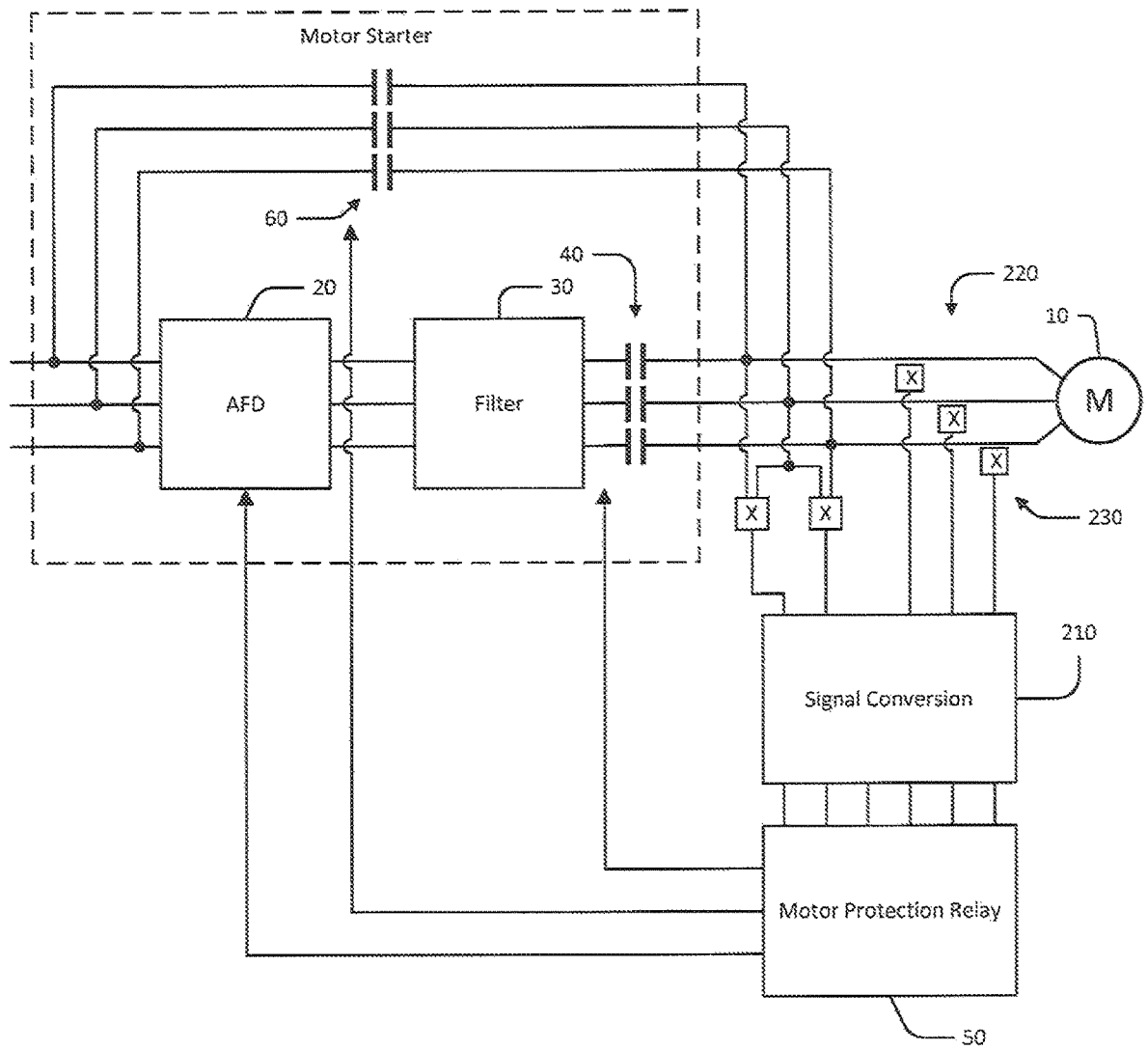
FIG. 10 is a schematic diagram illustrating a motor protection relay arrangement for a motor start application according to further embodiments.

Embodiments of the inventive subject matter may be used in a variety of different motor protection schemes in addition to those described above. For example, FIG. 9 illustrates an AFD application in which a motor protection relay 50 enables and disables an AFD 20 responsive to current and voltage sense signals received from magnetometer-based current and voltage sensors 220, 230. FIG. 10 illustrates a motor starter application in which a motor protection relay 50 is configured to enable and disable an output contactor 40, a bypass contactor 60 and/or an AFD 20 of a motor starter responsive to current and voltage sense signals received from magnetometer-based current and voltage sensors 220, 230. It will be appreciated that embodiments of the inventive subject matter may be used in other motor protection applications.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
    a magnetometer-based current sensor configured to sense a magnetic field generated by a current in at least one conductor connecting a motor drive output to a motor and to responsively produce a first current sense signal;
    a magnetometer-based voltage sensor configured to sense a magnetic field generated in response to a voltage of the at least one conductor and to responsively produce a first voltage sense signal;
    a signal conversion circuit configured to receive the first current sense signal and the first voltage sense signal and to generate a second current sense signal and a second voltage sense signal for provision to a current sense input and a voltage sense input, respectively, of a motor protection relay that protects the motor;
    a potential transformer having a secondary winding configured to be coupled to the voltage sense input of the motor protection relay; and
    a bypass circuit configured to selectively provide the first voltage sense signal to the signal conversion circuit and a primary winding of the potential transformer based on a frequency of the motor drive output.

2. The apparatus of claim 1, wherein the current sensor comprises a Hall effect current sensor or a fluxgate current sensor.

3. The apparatus of claim 2, wherein the current sensor comprises a closed-loop Hall effect current sensor and wherein the signal conversion circuit comprises:
    a burden resistor configured to conduct a current produced by the closed-loop Hall effect current sensor; and
    an amplifier configured to provide the second current sense signal to the motor protection relay responsive to a voltage across the burden resistor.

4. The apparatus of claim 3, wherein the signal conversion circuit further comprises a low pass filter configured to filter an output of the amplifier.

5. The apparatus of claim 4, wherein the low pass filter is configured to pass a base frequency of the motor drive and at least one switching frequency of the motor drive.

6. The apparatus of claim 1, wherein the voltage sensor comprises a Hall effect voltage sensor or a fluxgate voltage sensor.

7. The apparatus of claim 6, wherein the voltage sensor comprises a closed-loop Hall effect voltage sensor that produces a current output and wherein the signal conversion circuit comprises:
    a burden resistor configured to conduct the current output produced by the closed-loop Hall effect voltage sensor; and an amplifier configured to provide the second voltage sense signal to the motor protection relay responsive to a voltage across the burden resistor.

8. The apparatus of claim 7, wherein the signal conversion circuit further comprises a low pass filter configured to filter an output of the amplifier.

9. The apparatus of claim 8, wherein the low pass filter is configured to pass a base frequency of the motor drive and at least one switching frequency of the motor drive.

10. The apparatus of claim 7, wherein
the bypass circuit is configured to provide the voltage across the burden resistor to the primary winding of the potential transformer.

11. The apparatus of claim 10, wherein the bypass circuit is configured to connect the burden resistor to the primary winding of the potential transformer and break a connection between the burden resistor and an input of the amplifier responsive to the voltage across the burden resistor meeting a predetermined criterion.

12. The apparatus of claim 10, wherein the bypass circuit is configured to connect the burden resistor to the primary winding of the potential transformer before breaking the connection between the burden resistor and an input of the amplifier.

13. The apparatus of claim 1, further comprising the motor drive and the motor protection relay.

14. An apparatus comprising:
an adjustable-frequency drive (AFD) configured to be coupled to a motor by at least one conductor;
at least one magnetometer-based sensor configured to sense a current in the at least one conductor and/or to sense a voltage on the at least one conductor and to responsively produce a first sense signal;
a transformer configured to sense the current and/or the voltage independently of the at least one magnetometer-based sensor and to responsively produce an output signal;
a motor protection relay; and
a signal conversion/routing circuit configured to receive the first sense signal and to generate a second sense signal therefrom, to receive the output signal from the transformer and to selectively provide the second sense signal and the output signal from the transformer to the motor protection relay based on a frequency of the AFD.

15. The apparatus of claim 14, wherein the at least one magnetometer-based sensor comprises a Hall effect sensor or a fluxgate sensor.

16. The apparatus of claim 14, wherein the sensor comprises a closed-loop Hall effect sensor and wherein the signal conversion/routing circuit comprises:
a burden resistor configured to conduct a current produced by the Hall effect sensor; and
an amplifier configured to provide the second sense signal responsive to a voltage across the burden resistor.

17. The apparatus of claim 16, wherein the signal conversion/routing circuit further comprises a filter coupled to the amplifier and configured to filter the second sense signal.

18. An apparatus comprising:
at least one magnetometer-based sensor configured to sense a current in at least one conductor connecting a motor drive output to a motor and/or a voltage on the at least one conductor and to responsively produce a first sense signal;
a signal conversion circuit configured to receive the first sense signal and to generate a second sense signal for provision to sense input of a motor protection relay;
a potential transformer having a secondary winding configured to be coupled to the sense input of the motor protection relay; and
a bypass circuit configured to provide the first sense signal to a primary winding of the potential transformer to selectively apply an output of the potential transformer and the second sense signal to the sense input of the motor protection relay based on a frequency of the motor drive output.

* * * * *